United States Patent [19]

Kasperkovitz et al.

[11] Patent Number: 5,093,635
[45] Date of Patent: Mar. 3, 1992

[54] CONTROLLABLE OSCILLATOR HAVING TRANSCONDUCTANCE CIRCUITS WITH AMPLITUDE STABILIZATION

[75] Inventors: Wolfdietrich G. Kasperkovitz; Hendricus C. De Ruijter, both of Eindhoven, Netherlands

[73] Assignee: U.S. Philips Corporation, New York, N.Y.

[21] Appl. No.: 683,352

[22] Filed: Apr. 9, 1991

[30] Foreign Application Priority Data

Apr. 20, 1990 [NL] Netherlands .................. 9000944

[51] Int. Cl.⁵ .......................... H03B 5/20; H03B 5/24
[52] U.S. Cl. ............................. 331/108 B; 331/109; 331/135; 331/177 R; 331/183
[58] Field of Search .............. 331/45, 57, 108 B, 111, 331/135, 143, 109, 183, 177 R

[56] References Cited

U.S. PATENT DOCUMENTS

| | | |
|---|---|---|
| 3,936,773 | 2/1976 | Wilkinson ........................ 331/135 |
| 4,145,670 | 3/1979 | Bode ................................ 331/135 |
| 4,994,763 | 2/1991 | Chen et al. ....................... 331/57 |

*Primary Examiner*—Siegfried H. Grimm
*Attorney, Agent, or Firm*—Edward W. Goodman

[57] ABSTRACT

Controllable oscillator circuit comprising a regenerative loop which incorporates a cascade circuit of first and second sections each having a controllable gain and a phase shift which is 90° at the oscillation frequency, and an amplitude detection arrangement which is coupled between an output and a control input of at least one of the two sections. To obtain a comparatively large tuning control range and an effective amplitude stabilization, the two sections are mutually substantially equal and the first and second sections comprise first and second controllable transconductance circuits, respectively, outputs of which are coupled to third and fourth controllable transconductance circuits which are positively fed back from the output to the input, and which are coupled to first and second parallel RC filters and to inputs of the second and first controllable transconductance circuits, respectively, control inputs of the first and second transconductance circuits being coupled to a tuning control input and the output of at least one of the two first and second transconductance circuits being coupled to control inputs of the third and fourth transconductance circuits via the amplitude detection arrangement.

19 Claims, 2 Drawing Sheets

CONTROLLABLE OSCILLATOR HAVING TRANSCONDUCTANCE CIRCUITS WITH AMPLITUDE STABILIZATION

FIELD OF THE INVENTION

The invention relates to a controllable oscillator circuit comprising a regenerative loop which incorporates a cascade circuit of first and second sections each having a controllable gain and a phase shift which is 90° at the oscillation frequency, and an amplitude detection arrangement which is coupled between an output and a control input of at least one of the two sections.

BACKGROUND OF THE INVENTION

A controllable oscillator circuit of this type is known for example, from U.S. Pat. No. 3,936,773.

The cascade circuit of the two sections is regeneratively fed back from the output to the input for the frequency at which there is unity gain in the loop formed by the first and second sections and the feedback, with a phase shift of 90° in each of the two sections. To this end each of the two sections, hereinafter also referred to as quadrature sections, of the known oscillator circuit comprises an integrator and an analog multiplier.

For each frequency within a given frequency range the integrator realises a 90° phase shift, while the loop gain for a desired frequency within the last-mentioned frequency range is controlled at unity by means of said analog multiplier of each of the two quadrature sections. Since this frequency range determines the oscillator control range and is in itself comparatively narrow (in practice the integrators realise an accurate 90° phase shift only for some frequencies), the known oscillator circuit comprises a phase correction circuit in which a part of the output signal of one of the two quadrature sections is added to its input signal, which part is controllable in amplitude by means of the amplitude detection arrangement. Although this results in a given increase of the oscillator control range, it appears in practice that the control range of the known oscillator circuit is limited at its upper side to a maximum value of the order of 100 kHz. Furthermore, unwanted large deviations in the phase quadrature relation between the two phase quadrature oscillator signals are not prevented by means of said phase correction circuit. Moreover, comparatively large time constants are required for low oscillation frequencies in the known oscillator. To realise such large time constants in integrated circuits, a comparatively large chip surface is required so that the known oscillator, particularly for low oscillation frequencies, is less suitable for integration.

SUMMARY OF THE INVENTION

It is an object of the invention to provide, inter alia, a controllable oscillator circuit which can be easily implemented in an integrated form and has a frequency control range which is considerably larger than that of the known controllable oscillator circuit.

According to the invention, a controllable oscillator circuit of the type described in the opening paragraph is therefore characterized in that the two sections are mutually substantially equal and in that the first and second sections comprise first and second controllable transconductance circuits, respectively, outputs of which are coupled to third and fourth controllable transconductance circuits which are positively fed back from the output to the input, and which are coupled to first and second parallel RC filters and to inputs of the second and first controllable transconductance circuits, respectively, control inputs of the first and second transconductance circuits being coupled to a tuning control input and the output of at least one of the two first and second transconductance circuits being coupled to control inputs of the third and fourth transconductance circuits via the amplitude detection arrangement.

A controllable quadrature oscillator comprising a loop constituted by a cascade circuit of first and second sections, which cascade circuit is regeneratively fed back from output to input, is described in prior European Patent Application No. 89202963.8. Each section comprises two controllable amplifiers each having a low pass characteristic, a first amplifier being arranged in the signal path of the loop and a second amplifier being fed back and connected to the output of the first controllable amplifier. By a substantial gain control of the first amplifiers a unity gain is obtained in each section for a desired oscillation frequency, while a phase shift of 90° is obtained in each section for the desired oscillator frequency by a substantial gain control of the second fed back amplifiers.

However, when using the measure according to the invention, a control of the oscillation frequency is obtained by a variation of the transconductance of the first and second transconductance circuits. The third and fourth transconductance circuits positively fed back from the output to the input each realise a negative resistance whose value is automatically adjusted via the amplitude detection arrangement in such a way that these values entirely compensate the real resistances occurring in the loop, particularly those of the first and second parallel RC filters. As a result, the first and second transconductance circuits, combined with the capacitance of the first and second parallel RC filters function as ideal integrators each realising a phase shift of 90°. Such a resistance compensation by means of the third and fourth transconductance circuits and an adjustment of the loop gain at unity by means of the first and second transconductances is possible for oscillation frequencies in a frequency control or tuning range which is considerably larger than that of the known controllable oscillator circuit.

Due to the symmetrical configuration and the absence of large time constants, the controllable oscillator circuit according to the invention is particularly suitable for implementation in an integrated form and can not only be used for generating single oscillator signals but also for generating phase quadrature oscillator signals.

A preferred embodiment of a controllable oscillator circuit according to the invention is characterized in that a level adjusting circuit for adjusting the dc level of the output signal of the amplitude detection arrangement at a reference level is arranged between the amplitude detection arrangement and the control inputs of the third and fourth controllable transconductances.

When using this measure, a correct choice of the reference level enables the amplitude of the oscillator signals to be adjusted at a desired value.

A further preferred embodiment of a controllable oscillator circuit according to the invention is characterized in that the outputs of the first and second transconductance circuits are connected to in-phase and quadrature outputs of the oscillator circuit and are coupled to inputs of first and second synchronous amplitude detectors, respectively, of the amplitude detection arrangement for a synchronous amplitude detection of the signals at said in-phase and quadrature outputs, said two synchronous amplitude detectors being coupled to an adder circuit for mutually adding the output signals of the first and second synchronous amplitude detectors.

When using this measure, the amplitude detection arrangement can be realised in a simple manner.

A further preferred embodiment of such a controllable oscillator circuit is characterized in that each one of the first and second synchronous amplitude detectors has a signal and a mixing input, said two inputs of the first and second synchronous amplitude detectors being coupled in common to said in-phase and quadrature outputs, respectively.

When using this measure, a very fast amplitude detection and hence a broadband negative feedback and a fast compensation of oscillator amplitude variations of the oscillator outputs to the third and fourth transconductance circuits is obtained in a simple manner.

To reduce the influence of amplitude variations of the oscillator signal on the negative feedback gain, the last-mentioned embodiment is preferably characterized in that the adder circuit is coupled to an arrangement for determining the square root from the amplitude value of the input signal of the arrangement.

In a further preferred embodiment, which is characterized in that each one of the two synchronous amplitude detectors has a signal and a mixing input, in which said in-phase output is coupled to both the signal input and to the mixing input of the first synchronous amplitude detector via a first limiter and in which said quadrature output is coupled to both the signal input and to the mixing input of the second synchronous amplitude detector via a second limiter, which adder circuit is coupled to a lowpass filter, the amplitude detection arrangement is realised in a different manner.

The invention will be described in greater detail with reference to the Figures shown in the drawings which only serve to illustrate the invention and in which mutually corresponding elements have the same reference designations.

DESCRIPTION OF EMBODIMENTS

Figure 1:
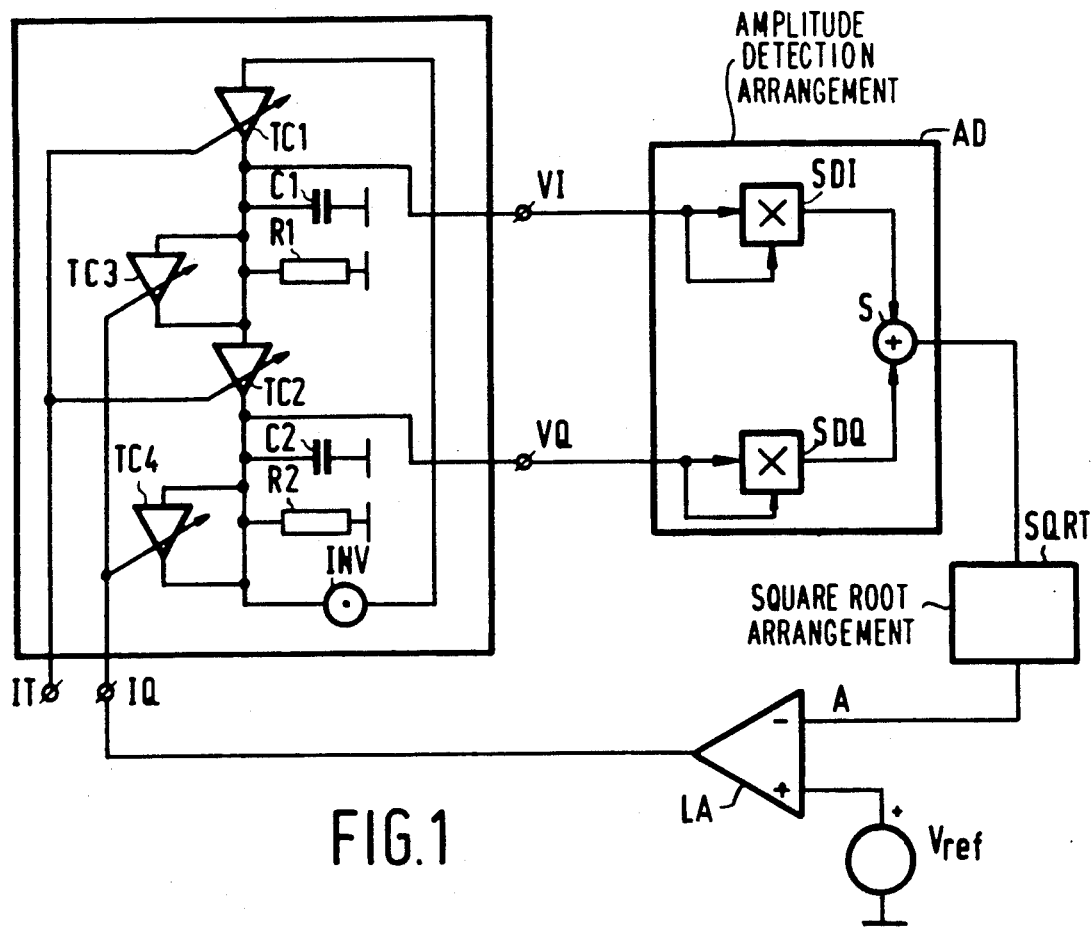
FIG. 1 is a block diagram of a controllable oscillator circuit according to the invention.

FIG. 1 is a block diagram of a controllable oscillator circuit according to the invention, comprising a regenerative loop which incorporates a cascade circuit of a first section TC1, R1C1, TC3 and a second section TC2, R2C2, TC4, which cascade circuit is regeneratively fed back for an oscillation frequency from the output to the input via an inverter circuit INV.

The first and second sections comprise first and second controllable transconductances TC1, TC2, respectively, outputs of which are coupled to third and fourth controllable transconductances TC3 and TC4, respectively, which are positively fed back from the output to the input, and to first and second parallel RC filters R1C1 and R2C2 and to inputs of the second and first controllable transconductances TC2 and TC1, respectively. The first and second parallel RC filters R1C1 and R2C2 comprise a parallel circuit of a first load resistor R1 with a first load capacitor C1 and a parallel circuit of a second load resistor R2 and a second load capacitor C2, respectively. The outputs of TC1 and TC2 are also connected to in-phase and quadrature outputs VI and VQ, respectively of the oscillator circuit, while in-phase and quadrature oscillator signals, for example $A \cos \omega_0 t$ and $A \sin \omega_0 t$ are available at said respective outputs. Control inputs of TC1 and TC2 are connected in common to a tuning control input IT for applying a tuning control signal It thereto. Control inputs of TC3 and TC4 are connected in common to an amplitude control input IQ to which an automatic amplitude control signal Iq is applied from an amplitude detection arrangement AD to be described hereinafter, via a level adjusting circuit LA.

The in-phase and quadrature outputs VI and VQ are connected to signal inputs as well as mixing inputs of first and second synchronous amplitude detectors SDI and SDQ, respectively, of the amplitude detection arrangement AD. These first and second synchronous amplitude detectors SDI and SDQ therefore square the in-phase and quadrature oscillator signals. The amplitude detection arrangement AD comprises an adder circuit S in which the two squared in-phase and quadrature oscillator signals $A^2 \sin^2 \omega_0 t$ and $A^2 \cos^2 \omega_0 t$ are jointly added, resulting in the squared oscillator signal amplitude $A^2$. The adder circuit S is coupled to an arrangement SQRT for determining the square root, which arrangement converts the last-mentioned squared oscillator signal amplitude $A^2$ into a signal A which represents the oscillator signal amplitudes at VI and VQ and which varies linearly therewith.

The arrangement SQRT is coupled to the previously mentioned level adjusting circuit LA in which the difference is formed between the last-mentioned signal A and a reference voltage Vref so that the dc signal level of the signal A is adjusted at a desired level determined by Vref. The signal thus obtained at the output of LA is applied as an automatic amplitude control signal to said amplitude control input IQ of TC3 and TC4. This results in a negative feedback of amplitude variations from the oscillator outputs VI, VQ to the amplitude control input IQ, which negative feedback has a very wide band due to the absence of a time constant.

The transconductance (voltage-current transmission factor) of the first and second controllable transconductances TC1 and TC2 is varied by means of a tuning control signal It at the tuning control input IT. This adjusts the loop gain for a desired oscillation frequency at unity. In order to comply also with a 360° phase shift in the loop at this frequency, a phase shift of 90° should be realised in each of the two sections TC1, R1C1, TC3 and TC2, R2C2, TC4. This is achieved by adjusting the transconductance of the controllable third and fourth transconductance circuits TC3 and TC4 in such a way that the values of the negative resistances obtained with TC3 and TC4 are equal to those of the load resistors R1 and R2 of the first and second parallel RC filters R1C1 and R2C2, respectively. An infinitely large resistance, which effectively corresponds to a situation in which R1 and R2 are absent, is produced parallel to the first and second load capacitors C1 and C2. Each of the two sections therefore functions as an ideal integrator in which a phase shift of 90° is realised.

In the regenerative state of the loop in which R1 and R2 are fully compensated for the oscillation frequency and in which there is thus a complete resistance de-attenuation or resistance compensation, the amplitude of the oscillator signals at VI and VQ increases. This increase of the oscillator output amplitude is converted via AD and SQRT into the signal A at the signal output of SQRT. When the threshold voltage determined by Vref is exceeded, the amplitude control signal Iq has such a value that it reduces the transconductance of TC3 and TC4. As a result, the resistance compensation of R1 and R2 decreases, i.e. the effective resistance value increases and the loop gain is attenuated so that the oscillator output amplitude decreases. This attenuation is effected until the signal A comes below the threshold voltage determined by Vref and the transconductances of the transconductance circuits TC3 and TC4 are adjusted via the amplitude control signal Iq in such a way that there is a complete resistance compensation again. Consequently, the amplitude level of the oscillator signals of VI and VQ is stabilised around a value adjustable by means of Vref.

Although the arrangement SQRT in itself reduces the influence of amplitude variations on the gain in the negative feedback from VI, VQ to TC3 and TC4, the arrangement SQRT is not essential for the operation of the oscillator circuit according to the invention and may be dispensed with.

The inverter circuit INV may be further incorporated at any arbitrary location in the loop and may be combined with TC1 or TC2, or in the case of a balanced implementation it may be realised by making a signal cross-connection at a suitable location in the loop.

Figure 2:
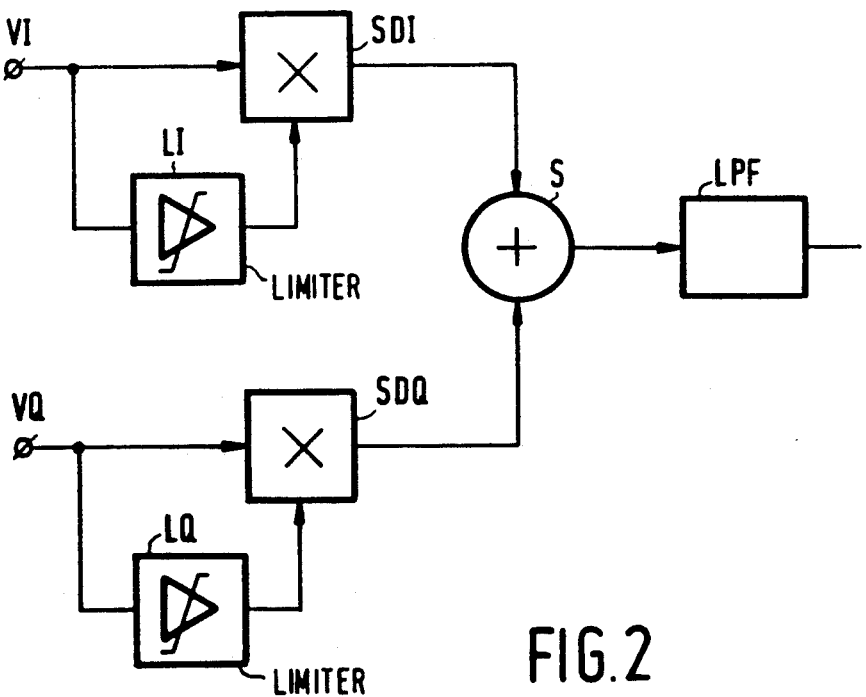
FIG. 2 shows a preferred embodiment of an amplitude detection arrangement for use in an oscillator circuit according to the invention.

FIG. 2 shows an amplitude detection arrangement in which the in-phase and quadrature oscillator outputs VI and VQ are connected to the signal inputs of SDI and SDQ, respectively, and to the mixing inputs of SDI and SDQ via first and second limiter circuits LI and LQ, respectively. The mixing products at the outputs of SDI and SDQ are added in S and do not only comprise the desired component, which represents the oscillator signal amplitude, but also higher order components. The desired oscillator signal amplitude component is selected in a lowpass filter LPF arranged at the output of the adder circuit S.

In practice the lowpass filter LPF may be dispensed with if the suppression obtained by means of C1 and C2 of these unwanted higher order components is sufficient.

Figure 3:
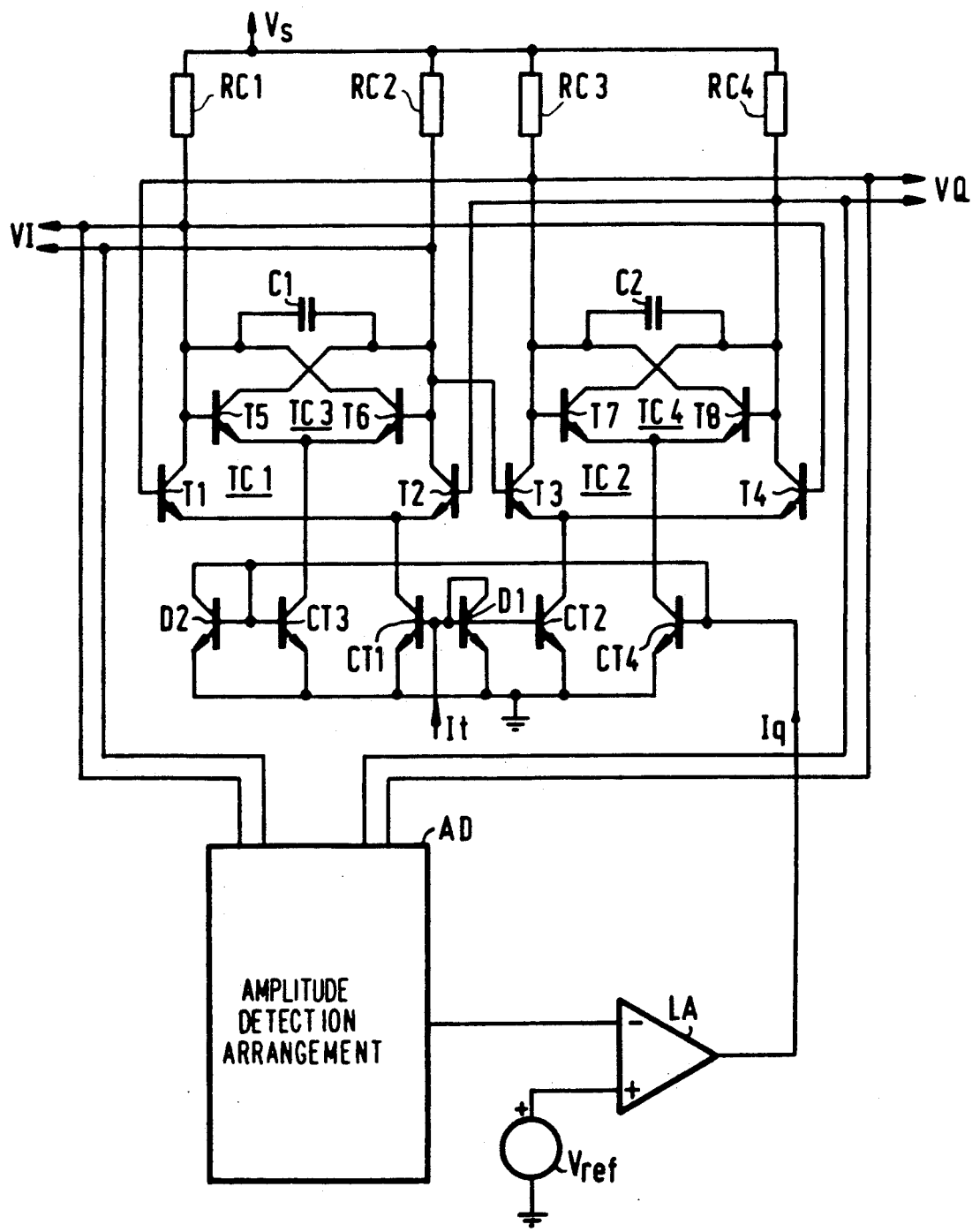
FIG. 3 shows a first integrable embodiment of an oscillator circuit according to the invention.

FIG. 3 shows a practical embodiment of a controllable oscillator circuit according to the invention which is particularly suitable to be realised in bipolar IC technology with first to fourth controllable transconductance circuits comprising first to eighth transistors T1 to T8 and first to fourth current source transistors CT1 to CT4, respectively, each functioning as a controllable current source. The emitters of T1 and T2, T3 and T4, T5 and T6, T7 and T8 are each connected to a common emitter tail. The emitter tail of the first to fourth difference pairs T1, T2; T3, T4; T5, T6 and T7, T8 thus obtained incorporate the current source transistors CT1 to CT4, respectively.

Said first to fourth difference pairs combined with the current source transistors CT1 to CT4 constitute a practical realisation of the first to fourth controllable transconductance circuits TC1 to TC4, respectively, of FIG. 1. The current source transistors CT1 and CT2, and CT3 and CT4 are output transistors of first and second controllable current mirror circuits with input control transistors D1 and D2, respectively, functioning as diodes. The collectors of T1 to T4 are connected to a supply voltage via first to fourth mutually equal load resistors RC1 to RC4, respectively, while the collectors of T1 and T2, T3 and T4 constitute the balanced in-phase and quadrature oscillator outputs VI and VQ, respectively. A first capacitance C1 and a second capacitance C2 are arranged between the collectors of T1 and T2, and T3 and T4, respectively. The collectors of T3, T4, T2 and T1 are coupled to the bases of T1 to T4, respectively. This mutual collector-base coupling results in a negative feedback of a cascade circuit of the first and second transconductances TC1 and TC2.

The third and fourth transconductance circuits TC3 and TC4 are each positively fed back from the output to the input and are connected to the outputs of the first and second transconductance circuits, respectively, because the collectors of T5 to T8 are connected to the bases of T6, T5, T8 and T7 and the collectors of T1 to T4 are connected to the bases of T5 to T8, respectively. These third and fourth controllable transconductance circuits TC3 and TC4 each constitute a negative resistor which is controllable by controlling the current of the current sources CT3 and CT4 by means of the amplitude control current Iq.

The balanced oscillator outputs VI and VQ are connected to balanced first and second synchronous amplitude detectors (not shown) of the amplitude detection arrangement AD which applies the amplitude control signal current Iq to the control input of said second current mirror circuit via LA.

In practice the tuning frequency FR is found to satisfy:

$$FR \approx \frac{It}{8\pi \cdot VT \cdot C}$$

in which VT is the thermal potential which is approximately 25 mV, It is the current of the current source transistors CT1 and CT2 and C is the capacitance of C1 and C2, respectively.

Tuning from lower to higher oscillation frequencies is realised by an increase of the tuning control current It. Consequently the input resistance $r_o$ of T1, T2 and T3, T4 decreases. The reverse applies to tuning in the reverse direction. The attenuation in the oscillator circuit is substantially determined by the input resistances $r_o$ of T1, T2 and T3, T4 and the load resistors RC1-RC4. By correct adjustment of the control current Iq the last-mentioned positive resistances $r_o$ and RC1-RC4 are completely compensated by the third and fourth controllable transconductance circuits TC3 and TC4 functioning as negative resistors so that a complete resistance compensation or deattenuation takes place. The oscillator circuit is then in the regenerative state. The control current Iq is varied in dependence upon the tuning control current It via the negative feedback across the amplitude detection arrangement AD and the level adjusting circuit LA in such a way that the oscillator circuit can be brought to the regenerative state and maintained in this state for frequencies in a comparatively large frequency control range.

Said negative feedback simultaneously enables the amplitude of the phase quadrature oscillator signals at VI and VQ to be stabilised at a desired level.

It will be evident that the level adjusting circuit LA can be dispensed with if AD is correctly dimensioned and if only one fixed value for the oscillator signal amplitude is desired.

We claim:

1. A controllable oscillator circuit comprising a regenerative loop which incorporates a cascade circuit of first and second sections each having a controllable gain and a phase shift which is 90° at the oscillation frequency, and an amplitude detection arrangement which is coupled between an output and a control input of at least one of the two sections, characterized in that the two sections are mutually substantially equal and in that the first and second sections comprise first and second controllable transconductance circuits, respectively, outputs of which are coupled to third and fourth controllable transconductance circuits which are positively fed back from the output to the input, and which are coupled to first and second parallel RC filters and to inputs of the second and first controllable transconductance circuits, respectively, control inputs of the first and second transconductance circuits being coupled to a tuning control input and the output of at least one of the two first and second transconductance circuits being coupled to control inputs of the third and fourth transconductance circuits via the amplitude detection arrangement.

2. A controllable oscillator circuit as claimed in claim 1, characterized in that a level adjusting circuit for adjusting the dc level of the output signal of the amplitude detection arrangement at a reference level is arranged between the amplitude detection arrangement and the control inputs of the third and fourth controllable transconductances.

3. A controllable oscillator circuit as claimed in claim 1, characterized in that the outputs of the first and second transconductance circuits are connected to in-phase and quadrature outputs of the oscillator circuit and are coupled to inputs of first and second synchronous amplitude detectors, respectively, of the amplitude detection arrangement for a synchronous amplitude detection of the signals at said in-phase and quadrature outputs, said two synchronous amplitude detectors being coupled to an adder circuit for mutually adding the output signals of the first and second synchronous amplitude detectors.

4. A controllable oscillator circuit as claimed in claim 3, characterized in that each one of the first and second synchronous amplitude detectors has a signal input and a mixing input, said two inputs of the first and second synchronous amplitude detectors being coupled in common to said in-phase and quadrature outputs, respectively.

5. A controllable oscillator circuit as claimed in claim 4, characterized in that the adder circuit is coupled to an arrangement for determining the square root from the amplitude value of the input signal of the arrangement.

6. A controllable oscillator circuit as claimed in claim 3, characterized in that each one of the two synchronous amplitude detectors has a signal input and a mixing input, said in-phase output being coupled to both the signal input and to the mixing input of the first synchronous amplitude detector via a first limiter and said quadrature output being coupled to both the signal input and to the mixing input of the second synchronous amplitude detector via a second limiter, said adder circuit being coupled to a lowpass filter.

7. A controllable oscillator circuit as claimed in claim 2, characterized in that the first and second transconductance circuits comprise first and second difference pairs, respectively, said first and second difference pairs comprising first and second, and third and fourth emitter-coupled transistors incorporating first and second current source transistors in a common emitter tail, said two current source transistors being controllable by means of a tuning control current at a tuning control input for controlling the transconductance of the first and second transconductance circuits, the collectors of said first to fourth transistors each being connected to a supply voltage via first to fourth load resistors and being coupled to the bases of the fourth, third, first and second transistors, first and second capacitances being arranged between the collectors of the first and second and the third and fourth transistors, respectively, said collectors being connected to a balanced in-phase output and a balanced quadrature output, respectively, and in that the third and fourth transconductance circuits comprise third and fourth difference pairs with fifth and sixth, and seventh and eighth emitter-coupled transistors incorporating third and fourth current source transistors in a common emitter tail, said two current source transistors being controllable for controlling the transconductance of the third and fourth transconductance circuits, the bases of the fifth to eighth transistors being coupled to the collectors of the first to fourth transistors, respectively, the transistors of the third and fourth difference pairs being fed back from collector to base, said balanced in-phase and quadrature outputs being coupled to the first and second synchronous amplitude detectors of the amplitude detection arrangement, said adder circuit being coupled to control inputs of the third and fourth current source transistors via a further transconductance circuit.

8. A controllable oscillator circuit as claimed in claim 2, characterized in that the outputs of the first and second transconductance circuits are connected to in-phase and quadrature outputs of the oscillator circuit and are coupled to inputs of first and second synchronous amplitude detectors, respectively, of the amplitude detection arrangement for a synchronous amplitude detection of the signals at said in-phase and quadrature outputs, said two synchronous amplitude detectors being coupled to an adder circuit for mutually adding the output signals of the first and second synchronous amplitude detectors.

9. A controllable oscillator circuit as claimed in claim 8, characterized in that each one of the first and second synchronous amplitude detectors has a signal input and a mixing input, said two inputs of the first and second synchronous amplitude detectors being coupled in common to said in-phase and quadrature outputs, respectively.

10. A controllable oscillator circuit as claimed in claim 9, characterized in that the adder circuit is coupled to an arrangement for determining the square root from the amplitude value of the input signal of the arrangement.

11. A controllable oscillator circuit as claimed in claim 8, characterized in that each one of the two synchronous amplitude detectors has a signal input and a mixing input, said in-phase output being coupled to both the signal input and to the mixing input of the first synchronous amplitude detector via a first limiter and said quadrature output being coupled to both the signal input and to the mixing input of the second synchronous amplitude detector via a second limiter, said adder circuit being coupled to a lowpass filter.

12. A controllable oscillator circuit as claimed in claim 3, characterized in that the first and second transconductance circuits comprise first and second difference pairs, respectively, said first and second difference pairs comprising first and second, and third and fourth emitter-coupled transistors incorporating first and second current source transistors in a common emitter tail, said two current source transistors being controllable by means of a tuning control current at a tuning control input for controlling the transconductance of the first and second transconductance circuits, the collectors of said first to fourth transistors each being connected to a supply voltage via first to fourth load resistors and being coupled to the bases of the fourth, third, first and second transistors, first and second capacitances being arranged between the collectors of the first and second and the third and fourth transistors, respectively, said collectors being connected to a balanced in-phase output and a balanced quadrature output, respectively, and in that the third and fourth transconductance circuits comprise third and fourth difference pairs with fifth and sixth, and seventh and eighth emitter-coupled transistors incorporating third and fourth current source transistors in a common emitter tail, said two current source transistors being controllable for controlling the transconductance of the third and fourth transconductance circuits, the bases of the fifth to eighth transistors being coupled to the collectors of the first to fourth transistors, respectively, the transistors of the third and fourth difference pairs being fed back from collector to base, said balanced in-phase and quadrature outputs being coupled to the first and second synchronous amplitude detectors of the amplitude detection arrangement, said adder circuit being coupled to control inputs of the third and fourth current source transistors via a further transconductance circuit.

13. A controllable oscillator circuit as claimed in claim 4, characterized in that the first and second transconductance circuits comprise first and second difference pairs, respectively, said first and second difference pairs comprising first and second, and third and fourth emitter-coupled transistors incorporating first and second current source transistors in a common emitter tail, said two current source transistors being controllable by means of a tuning control current at a tuning control input for controlling the transconductance of the first and second transconductance circuits, the collectors of said first to fourth transistors each being connected to a supply voltage via first to fourth load resistors and being coupled to the bases of the fourth, third, first and second transistors, first and second capacitances being arranged between the collectors of the first and second and the third and fourth transistors, respectively, said collectors being connected to a balanced in-phase output and a balanced quadrature output, respectively, and in that the third and fourth transconductance circuits comprise third and fourth difference pairs with fifth and sixth, and seventh and eighth emitter-coupled transistors incorporating third and fourth current source transistors in a common emitter tail, said two current source transistors being controllable for controlling the transconductance of the third and fourth transconductance circuits, the bases of the fifth to eighth transistors being coupled to the collectors of the first to fourth transistors, respectively, the transistors of the third and fourth difference pairs being fed back from collector to base, said balanced in-phase and quadrature outputs being coupled to the first and second synchronous amplitude detectors of the amplitude detection arrangement, said adder circuit being coupled to control inputs of the third and fourth current source transistors via a further transconductance circuit.

14. A controllable oscillator circuit as claimed in claim 5, characterized in that the first and second transconductance circuits comprise first and second difference pairs, respectively, said first and second difference pairs comprising first and second, and third and fourth emitter-coupled transistors incorporating first and second current source transistors in a common emitter tail, said two current source transistors being controllable by means of a tuning control current at a tuning control input for controlling the transconductance of the first and second transconductance circuits, the collectors of said first to fourth transistors each being connected to a supply voltage via first to fourth load resistors and being coupled to the bases of the fourth, third, first and second transistors, first and second capacitances being arranged between the collectors of the first and second and the third and fourth transistors, respectively, said collectors being connected to a balanced in-phase output and a balanced quadrature output, respectively, and in that the third and fourth transconductance circuits comprise third and fourth difference pairs with fifth and sixth, and seventh and eight emitter-coupled transistors incorporating third and fourth current source transistors in a common emitter tail, said two current source transistors being controllable for controlling the transconductance of the third and fourth transconductance circuits, the bases of the fifth to eighth transistors being coupled to the collectors of the first to fourth transistors, respectively, the transistors of the third and fourth difference pairs being fed back from collector to base, said balanced in-phase and quadrature outputs being coupled to the first and second synchronous amplitude detectors of the amplitude detection arrangement, said adder circuit being coupled to control inputs of the third and fourth current source transistors via a further transconductance circuit.

15. A controllable oscillator circuit as claimed in claim 6, characterized in that the first and second transconductance circuits comprise first and second difference pairs, respectively, said first and second difference pairs comprising first and second, and third and fourth emitter-coupled transistors incorporating first and second current source transistors in a common emitter tail, said two current source transistors being controllable by means of a tuning control current at a tuning control input for controlling the transconductance of the first and second transconductance circuits, the collectors of said first to fourth transistors each being connected to a supply voltage via first to fourth load resistors and being coupled to the bases of the fourth, third, first and second transistors, first and second capacitances being arranged between the collectors of the first and second and the third and fourth transistors, respectively, said collectors being connected to a balanced in-phase output and a balanced quadrature output, respectively, and in that the third and fourth transconductance circuits comprise third and fourth difference pairs with fifth and sixth, and seventh and eighth emitter-coupled transistors incorporating third and fourth current source transistors in a common emitter tail, said two current source transistors being controllable for controlling the transconductance of the third and fourth transconductance circuits, the bases of the fifth to eighth transistors being coupled to the collectors of the first to fourth transistors, respectively, the transistors of the third and fourth difference pairs being fed back from collector to base, said balanced in-phase and quadrature outputs being coupled to the first and second synchronous amplitude detectors of the amplitude detection arrangement, said adder circuit being coupled to control inputs of the third and fourth current source transistors via a further transconductance circuit.

16. A controllable oscillator circuit as claimed in claim 8, characterized in that the first and second transconductance circuits comprise first and second difference pairs, respectively, said first and second difference pairs comprising first and second, and third and fourth emitter-coupled transistors incorporating first and second current source transistors in a common emitter tail, said two current source transistors being controllable by means of a tuning control current at a tuning control input for controlling the transconductance of the first and second transconductance circuits, the collectors of said first to fourth transistors each being connected to a supply voltage via first to fourth load resistors and being coupled to the bases of the fourth, third, first and second transistors, first and second capacitances being arranged between the collectors of the first and second and the third and fourth transistors, respectively, said collectors being connected to a balanced in-phase output and a balanced quadrature output, respectively, and in that the third and fourth transconductance circuits comprise third and fourth difference pairs with fifth and sixth, and seventh and eighth emitter-coupled transistors incorporating third and fourth current source transistors in a common emitter tail, said two current source transistors being controllable for controlling the transconductance of the third and fourth transconductance circuits, the bases of the fifth to eighth transistors being coupled to the collectors of the first to fourth transistors, respectively, the transistors of the third and fourth difference pairs being fed back from collector to base, said balanced in-phase and quadrature outputs being coupled to the first and second synchronous amplitude detectors of the amplitude detection arrangement, said adder circuit being coupled to control inputs of the third and fourth current source transistors via a further transconductance circuit.

17. A controllable oscillator circuit as claimed in claim 9, characterized in that the first and second transconductance circuits comprise first and second difference pairs, respectively, said first and second difference pairs comprising first and second, and third and fourth emitter-coupled transistors incorporating first and second current source transistors in a common emitter tail, said two current source transistors being controllable by means of a tuning control current at a tuning control input for controlling the transconductance of the first and second transconductance circuits, the collectors of said first to fourth transistors each being connected to a supply voltage via first to fourth load resistors and being coupled to the bases of the fourth, third, first and second transistors, first and second capacitances being arranged between the collectors of the first and second and the third and fourth transistors, respectively, said collectors being connected to a balanced in-phase output and a balanced quadrature output, respectively, and in that the third and fourth transconductance circuits comprise third and fourth difference pairs with fifth and sixth, and seventh and eighth emitter-coupled transistors incorporating third and fourth current source transistors in a common emitter tail, said two current source transistors being controllable for controlling the transconductance of the third and fourth transconductance circuits, the bases of the fifth to eighth transistors being coupled to the collectors of the first to fourth transistors, respectively, the transistors of the third and fourth difference pairs being fed back from collector to base, said balanced in-phase and quadrature outputs being coupled to the first and second synchronous amplitude detectors of the amplitude detection arrangement, said adder circuit being coupled to control inputs of the third and fourth current source transistors via a further transconductance circuit.

18. A controllable oscillator circuit as claimed in claim 10, characterized in that the first and second transconductance circuits comprise first and second difference pairs, respectively, said first and second difference pairs comprising first and second, and third and fourth emitter-coupled transistors incorporating first and second current source transistors in a common emitter tail, said two current source transistors being controllable by means of a tuning control current at a tuning control input for controlling the transconductance of the first and second transconductance circuits, the collectors of said first to fourth transistors each being connected to a supply voltage via first to fourth load resistors and being coupled to the bases of the fourth, third, first and second transistors, first and second capacitances being arranged between the collectors of the first and second and the third and fourth transistors, respectively, said collectors being connected to a balanced in-phase output and a balanced quadrature output, respectively, and in that the third and fourth transconductance circuits comprise third and fourth difference pairs with fifth and sixth, and seventh and eighth emitter-coupled transistors incorporating third and fourth current source transistors in a common emitter tail, said two current source transistors being controllable for controlling the transconductance of the third and fourth transconductance circuits, the bases of the fifth to eighth transistors being coupled to the collectors of the first to fourth transistors, respectively, the transistors of the third and fourth difference pairs being fed back from collector to base, said balanced in-phase and quadrature outputs being coupled to the first and second synchronous amplitude detectors of the amplitude detection arrangement, said adder circuit being coupled to control inputs of the third and fourth current source transistors via a further transconductance circuit.

19. A controllable oscillator circuit as claimed in claim 11, characterized in that the first and second transconductance circuits comprise first and second difference pairs, respectively, said first and second difference pairs comprising first and second, and third and fourth emitter-coupled transistors incorporating first and second current source transistors in a common emitter tail, said two current source transistors being controllable by means of a tuning control current at a tuning control input for controlling the transconductance of the first and second transconductance circuits, the collectors of said first to fourth transistors each being connected to a supply voltage via first to fourth load resistors and being coupled to the bases of the fourth, third, first and second transistors, first and second capacitances being arranged between the collectors of the first and second and the third and fourth transistors, respectively, said collectors being connected to a balanced in-phase output and a balanced quadrature output, respectively, and in that the third and fourth transconductance circuits comprise third and fourth difference pairs with fifth and sixth, and seventh and eighth emitter-coupled transistors incorporating third and fourth current source transistors in a common emitter tail, said two current source transistors being controllable for controlling the transconductance of the third and fourth transconductance circuits, the bases of the fifth to eighth transistors being coupled to the collectors of the first to fourth transistors, respectively, the transistors of the third and fourth difference pairs being fed back from collector to base, said balanced in-phase and quadrature outputs being coupled to the first and second synchronous amplitude detectors of the amplitude detection arrangement, said adder circuit being coupled to control inputs of the third and fourth current source transistors via a further transconductance circuit.

* * * * *